United States Patent
Völkel

[11] Patent Number: 6,134,426
[45] Date of Patent: Oct. 17, 2000

[54] RADIO RECEIVER

[75] Inventor: Andreas Völkel, Wetzlar, Germany

[73] Assignee: U.S. Philips Corporation, New York, N.Y.

[21] Appl. No.: 09/075,681

[22] Filed: May 11, 1998

[30]    Foreign Application Priority Data

May 13, 1997  [DE]   Germany ................... 197 19 912

[51] Int. Cl.⁷ .................................................. H04B 1/18
[52] U.S. Cl. ........................... 455/161.3; 455/180.2
[58] Field of Search ........................... 455/186.1, 185.1,
            455/161.1, 161.2, 161.3, 166.1, 166.2, 226.1,
                           226.2, 345, 180.1, 180.2, 179.1

[56]              References Cited

U.S. PATENT DOCUMENTS

| | | | |
|---|---|---|---|
| 5,457,816 | 10/1995 | Koyama | 455/161.2 |
| 5,603,108 | 2/1997 | Thoone | 455/186.1 |
| 5,745,845 | 4/1998 | Suenaga et al. | 455/186.1 |
| 5,749,048 | 5/1998 | Masuda | 455/186.1 |
| 5,802,066 | 9/1998 | Miyake et al. | 455/161.2 |

FOREIGN PATENT DOCUMENTS

| | | | |
|---|---|---|---|
| 0095564A1 | 12/1983 | European Pat. Off. | H03J 1/04 |
| 404126403 | 4/1992 | Japan | 455/186.1 |
| 2213336A | 8/1989 | United Kingdom | H03J 1/02 |

*Primary Examiner*—Nay Maung
*Assistant Examiner*—Quochien B. Vuong
*Attorney, Agent, or Firm*—Edward W. Goodman

[57]              ABSTRACT

A description is given of a radio receiver, in particular a VHF receiver, including a receiver stage, an evaluation stage, a memory stage, an operating element, a display element and a control unit. A database of stations which meet predetermined receiving criteria is stored by the control unit in the memory stage. Updating this database is subject to different preconditions, and requires only one receiver stage. The operating element can be used to call the desired stations from the database, in a sequence determined in accordance with different criteria, and these stations can be set to reproduce the radio signals.

5 Claims, 2 Drawing Sheets

RADIO RECEIVER

BACKGROUND OF THE INVENTION

1. Field of the Invention

The invention relates to a radio receiver, in particular, a VHF receiver, comprising

- a receiver stage for receiving and demodulating a radio signal,
- an evaluation stage for evaluating the quality of the received radio signals in accordance with predetermined receiving criteria,
- a storage stage for storing data about at least transmitter frequencies and/or transmitter names of stations whose radio signals meet said predetermined receiving criteria,
- an operating element for setting the receiver stage so as to receive the radio signal of a desired station,
- a display element for displaying information about at least the desired station, which information is derived from the stored data, and
- a control unit for controlling at least the receiver stage, the storage stage and the display element according to the operation of the operating element, and for controlling the receiving quality evaluated by the evaluation stage.

2. Description of the Related Art

European Patent specification EP-A-95564 discloses a mobile radio receiver, in particular a car radio with direct program selection, which comprises, in an operating panel, program display surfaces and, associated therewith, selection keys for selecting the programs displayed. To obtain a small well laid-out operating panel which displays a plurality of radio programs receivable at different locations of the radio receiver, exchangeable program displays can be reproduced on the program display surfaces, this exchangeable program representing an up-to-date selection of the programs transmitted by stations having receiving quality at the current receiver location which satisfy predetermined receiving criteria, for example, a predetermined received field strength.

This known radio receiver comprises a random-access coupling memory (RAM) having a number of memory locations, each memory location being permanently allocated to one of the program display surfaces with the associated selection key. station-defining quantities of the stations which can be received at the receiver location and which satisfy the predetermined receiving criteria, are allocated to this coupling memory. This allocation is continuously updated. Said continuous update of the memory contents in response to a change in receiver location requires, in the known radio receiver, a circuit whose essential components are a second receiver member having an automatic station finder to permanently search stations which can be received, a station identification device to identify the station found and a receiving-quality control device to check the receiving quality of the station found. The known radio receiver comprises said components in addition to the receiver member necessary to receive and reproduce the desired programs.

U.K. Patent Application GB-A-2 213 336 discloses an RDS radio receiver with display of alternate frequencies of specific radio stations. This radio receiver comprises a tuning stage which is operable over at least two frequency bands. Connected to this tuning stage is a data decoding means for decoding data signals transmitted together with a received radio signal. The received radio signal is broadcast within a first frequency band, for example, the medium waveband. The data signals comprise data relating to radio signals within the first frequency band and data relating to radio signals within the other frequency bands, for example, the long waveband. Connected to the data decoding means is a data storing means for storing the data signals relating to the other frequency bands. The data, which relate to a selected radio signal, are at least partly displayed on a touch-sensitive display. In this manner, RDS data, which are transmitted at frequencies on which the RDS system operates and which relate to frequencies, in particular, for the same radio program at which no RDS signal is transmitted, are stored by means of the receiver arrangement. In this way, a selection of all, or at least a part, of the frequencies relating to a radio program can be displayed, on the display and the desired frequency relating to the desired radio program can be selected.

The radio receivers in accordance with the state of the art are, on the one hand, constructed in a relatively complex and expensive manner and/or, on the other hand, exhibit a limited range of applications. For example, particularly in the case of daily commodities manufactured in large numbers, such as a radio receiver, the use of two concurrently operating complete receiver elements (tuner), of which only one is necessary during the major part of the service life of the radio receiver, leads to a very high and uneconomical extra expenditure. On the other hand, the above-described display devices are also very expensive and, in particular, require much space on the front side of the radio receivers where, in general, all operating elements of such a radio receiver are arranged. Particularly in the case of radio receivers for use in motor vehicles, where the standardized dimensions of the housings cause the dimensions of the front surfaces of the radio receivers to be bound to narrow limits, every extensive operating element causes great constructional problems. In addition, the operation by the listener becomes more complex as the number of operating elements increases. On the other hand, also in the case of radio receivers for use in other fields of application, the ratio of the space occupied by the operating elements to the space occupied by the other elements increases as a result of the miniaturization of the components, so that a simplification of the operating elements, without adversely affecting the ease of operation as the number of power characteristics of such radio receivers increase, is urgently needed.

SUMMARY OF THE INVENTION

It is an object of the invention to construct a radio receiver of the type mentioned in the opening paragraph in such a way that a range of desired stations is provided in a simple, space-saving and accessible manner and at low manufacturing costs.

In accordance with the invention, this object is achieved in a radio receiver of the type mentioned in the opening paragraph in that for tuning the receiver stage into the desired station, the data of the stations whose radio signals meet the predetermined receiving criteria can be read from the memory stage, in a sequence determined by the control unit in accordance with selectable characteristics, by operating the operating element, said operating element comprising a single selection member enabling switching from a desired station to the previous or subsequent station in accordance with said sequence, and in that the data stored in the memory stage are at least partly updated, under any one of the following freely selectable conditions, to form data of stations whose radio signals directly meet the predetermined receiving criteria:

when the receiving quality of the radio signal of a desired station currently does not, or no longer, meets the predetermined receiving criteria, the relevant data in the memory stage are erased and the receiver stage is tuned to receive the radio signal of a new, desired station; preferably, the new, desired station broadcasts the same program as the hitherto desired station, and the data of the new, desired station replace the erased data of the hitherto desired station in the memory stage; it is particularly preferred that the new desired station is found by autoscanning of the receiver stage;

when the desired station is replaced by a new desired station by operating the operating element, it is checked whether the radio signal of the new, desired station meets the predetermined receiving criteria; if so, the data in the memory stage of the control unit are replaced by the data of the new, desired station; preferably, the transmission frequency of the new, desired station is found by autoscanning of the receiver stage;

before at least the receiver stage of the radio receiver is turned off, the data of the stations having radio signals which meet the predetermined receiving criteria are stored again in the memory stage by the control unit by means of an autoscanning operation for a frequency range which is as wide as possible, preferably all frequencies to which the receiver stage can be tuned;

whereby the data of the stations are gained from the determination of the transmission frequencies of the received radio signals and/or from an RDS data flow received as a part of the radio signals.

In the present invention, the term "station" is to be taken to mean a signal which comprises, modulated on a transmission frequency or carrier frequency, radio signals, in particular sound signals and, possibly, data signals, and which is broadcast by a radio station via a transmission station at a specific location. The term "program" is to be taken to mean the radio signal comprising a specific information content. A program which is broadcast in Germany, for example, as "NDR1", "WDR1", "SFB", etc., can be broadcast via a plurality of transmission stations at different locations, said program being modulated on different transmission frequencies (carrier frequencies)

The expression "search tuning" is to be taken to mean here the (automatic) tuning of the receiver stage, in particular, with the aid of the control unit, this search tuning being continued until a radio signal or station is received. In the present invention, if the radio receiver or at least its receiver stage is switched off, the entire radio receiver or only the receiver stage is put out of operation, and, for example, sound reproduction devices, particularly, loudspeakers included in the radio receiver, can be used to reproduce sound signals from other sound sources, for example, sound signals from audio cassettes or CDs.

In each of the above cases, however, after the radio receiver or receiver stage has been switched off, the receiver stage of said radio receiver is no longer needed to reproduce sound signals of a station or a program.

The invention has the advantage that a radio receiver is provided which, on the one hand, is of a simple construction and, on the other hand, comprises simple, space-saving, accessible operating elements. Advantageously, at least the evaluation stage and the control unit are comprised in a microprocessor. By programming said microprocessor, a very powerful and flexible organization of the data in the memory stage can be achieved.

The selection member may take the form of a scan-tuning key, however, it preferably takes the form of a station-tuning knob. This enables the desired station to be selected by means of an ergonomically favorable operation. To this end, the operating element comprises an incrementing means which is coupled to the selection member and which serves to switch to the station adjoining the current station in the predetermined sequence. A specific angle of rotation of the station-tuning knob may serve in principle to switch from one station to the next or preceding station; on the other hand, a predetermined angle of rotation can also correspond to a specific frequency distance in the range of transmission frequencies; by suitably constructing the incrementing means or suitably defining the processing steps for the signals supplied by the incrementing means, it is easy to choose between said possibilities. Also, this choice has a favorable effect on the ergonomy of the operating element. To determine the sequence in which the data are read from the memory stage, a selection can be made from different characteristics of the stations found. For example, the transmission frequency may be selected, so that during operation of the operating element, the stations stored in the memory stage are set in accordance with the sequence of their transmission frequencies. Another, equally simple, possibility consists in an alphabetically determined sequence of the stations according to the station names, so that the listener can more easily select the station corresponding to a searched program. Thus, if the listener wants to receive a specific program, he can immediately set the name of the station (which may also be referred to as the name of the program) via the operating element, without having to search or scan the frequency range, and without having to know how the names of the stations are allocated to the frequency range.

BRIEF DESCRIPTION OF THE DRAWINGS

The drawings show an example of a radio receiver in accordance with the invention.

In said drawings.

DESCRIPTION OF THE PREFERRED EMBODIMENTS

Figure 1:
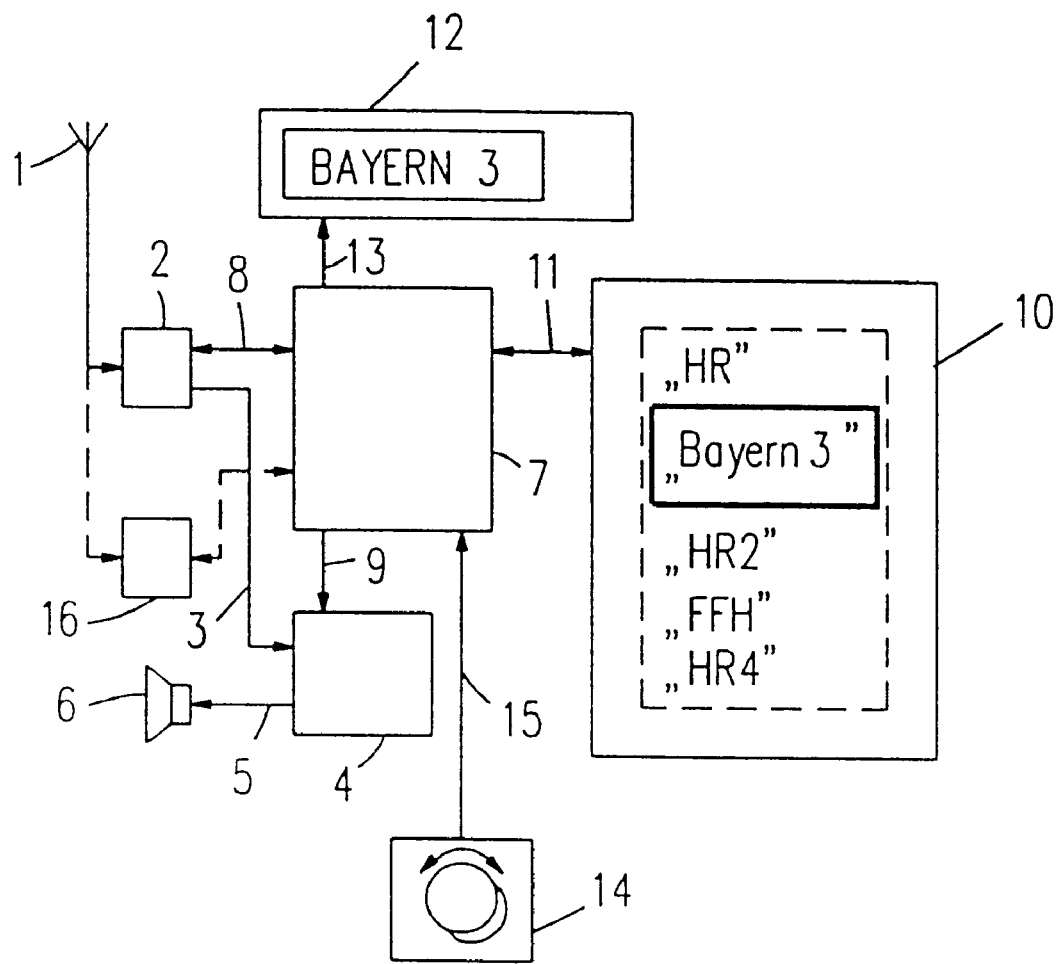
FIG. 1 shows a block diagram of the radio receiver.

FIG. 1 shows a coarse schematic block diagram of a radio receiver in accordance with the invention. Via an antenna 1, radio signals to be received reach a receiver stage 2 in which they are demodulated in a customary manner. The resultant low-frequency sound signals are supplied via a line 3 to a sound-signal amplifier 4 where they are amplified and, for reproduction, supplied via a loudspeaker line 5 to a loudspeaker 6. These components of the radio receiver, i.e., the antenna 1 up to and including the loudspeaker 6, are constructed in a customary manner.

The radio receiver shown in FIG. 1 also comprises a control unit 7, which is preferably constructed so as to include a microprocessor, and which is connected via signal or control lines 8, 9 to, respectively, the receiver stage 2 and the amplifier 4. Also connected to the control unit 7 is a memory stage 10, via a data line 11, a display element 12, via a line 13, and an operating element 14, via a control line 15. In the present example, the control unit 7 comprising a microprocessor also includes an evaluation stage for evaluating, in accordance with predetermined receiving criteria, such as the received field strength, the receiving quality of the radio signals received from the receiver stage 2 via the antenna 1. Thus, in this case, the microprocessor takes over the function of the evaluation stage of the control unit for the control operations in accordance with the invention, and it controls the data and signal flow in and between the other components of the radio receiver shown. As current radio receivers are microprocessor-controlled anyway, for example, for search tuning and setting the sound-reproduction parameters (volume, tone color, balance between a number of loudspeakers, switching between different sound-signal sources, etc.), this microprocessor control can also be used in a simple manner for constructing the radio receiver in accordance with the invention, without an appreciable increase in manufacturing costs. By virtue thereof, the advantages of the invention, that is, a simplification of the display and operating elements, are emphasized in a special manner.

In the radio receiver in accordance with the invention, a scan tuning operation, which is known per se, in which the receiver stage 2 is tuned by means of the control unit 7, is employed in known manner to find the radio signals of the stations to be received, particularly of a desired station, within the frequency range (wavelength range) covered by the receiver stage 2. The evaluation stage, that is, the microprocessor of the control unit 7, checks whether the radio signals of a station found meet the predetermined receiving criteria. It is checked, in particular, whether the received field strength does not fall short of a predetermined limiting value. However, other receiving criteria can be checked too, for example, the distortion factor or the amplitude of specific data signals or identifying signals in the radio signal, such as the stereo identifying signal. If the received radio signal meets the predetermined receiving criteria, all data which can be extracted from this radio signal are used to form or update a database in the memory stage 10. To this end, in particular, the detected transmission frequency of the station into which the receiver stage 2 is currently tuned, is stored in the memory stage 10. The radio signal may additionally contain, preferably, RDS data signals containing further information about the station currently tuned into. Also these data are stored in the memory stage 10. In this manner, the stored data, collected by means of scan tuning throughout the frequency range, form a database of stations which can be received immediately and whose receiving quality meets the predetermined receiving criteria. In addition, the evaluation of RDS data enables data about other stations to be stored, and, in an embodiment of the radio receiver in accordance with the invention, the receiver stage 2 of the control unit 7 can also be tuned into these additional stations so as to detect whether these stations also meet the predetermined receiving criteria.

Figure 2:
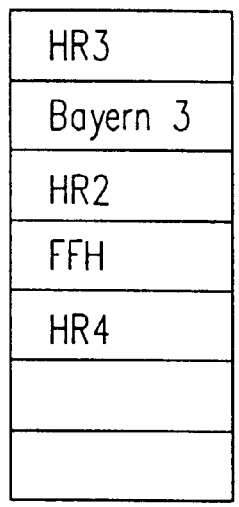
FIG. 2 shows, as a strongly simplified example, a list of stations whose receiving quality meets predetermined receiving criteria.
Figure 3:
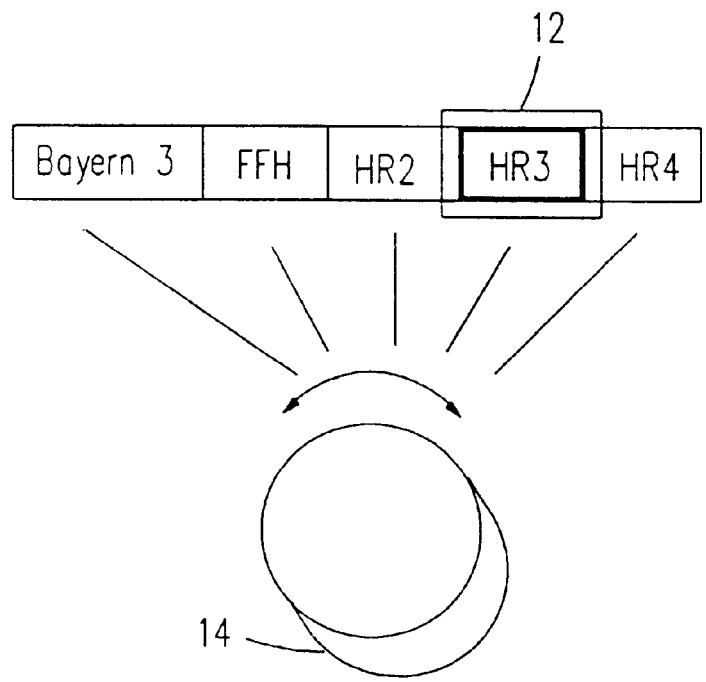
FIG. 3 shows a symbolic, alphabetical ordering of the station names with their allocation to the operating element.

The database of stations which can be received with sufficient receiving quality, said database being stored in the memory stage 10, is at the disposal of the user of the radio receiver (radio listener) to make a selection via the operating element 14. By way of a very simple example, FIG. 2 shows a coarse schematic representation of the listing of five different stations, thus forming a database of stations to be received in the memory stage 10. This database initially contains the un-ordered data of the stations, such as they were found and stored during scan tuning. A function of the microprocessor, which is needed anyway by the control unit 7 to control the memory stage 10, enables this initially un-ordered database to be sorted in accordance with different selectable criteria. By virtue thereof, the stations which meet the receiving criteria (stations of sufficient receiving quality) can be made available in a simple manner, for example, alphabetically, to the radio listener operating the operation element. Thus, by operating the operation element 14, the individual stations can be selected in a specific sequence, as schematically shown in FIG. 3. When rotating the selection member of the operation element 14, which is constructed so as to be a stationtuning knob, a changeover to other stations in accordance with the alphabetic order of their names takes place, and the name of the selected, i.e., desired station, this station being controlled by the control unit 7 via the line 13, is displayed by the display element 12. In the example shown in FIG. 1, this is the station "Bayern 3", and in the example shown in FIG. 3, this is the station "HR 3".

By analogy with the conventional station-tuning frequency scale, a different sorting possibility is obtained as a result of the fact that the database in the memory stage 10 is sorted and made accessible in accordance with increasing transmission frequencies of the stations of sufficient receiving quality. By means of the operating element 14, the individual stations can be subsequently selected, that is, the desired station can be selected in the same manner as with the conventional frequency scale (station scale of a conventional radio receiver).

Particularly for mobile applications of the radio receiver in accordance with the invention, it is important to regularly update the database in the memory stage 10 as the local receiving conditions, and hence, the receiving quality of the individual stations can often be subject to substantial variations. In the radio receiver in accordance with the invention, the database is updated by the control unit 7 each time the receiver stage 2 is not continuously needed to receive a radio signal which is to be reproduced at once, or also during such a reproduction by evaluation of the RDS data signal. Thus, in the control unit 7, the evaluation stage comprised therein continuously monitors the receiving quality of the desired station just reproduced. If this station does not meet, or no longer meets, the predetermined receiving criteria, that is, if the reception of the desired station is of a poor quality, the associated data in the memory stage 10 are erased and the receiver stage is adjusted to receive the radio signal of a new, desired station. Preferably, said new desired station presents the same program as the hitherto desired station, and the data of the new, desired station replace the erased data of the hitherto desired station in the memory stage 10. The data of the new, desired station can be detected by a scan-tuning operation of the receiver stage 2 or it is alternatively possible that, as a result of evaluation of RDS data signals, the memory stage 10 already contains data about different stations with the same program, and that these data are successively called by the control unit 7, checked for receiving quality and, if they meet the receiving criteria, the station found is set as a new desired station and its program is reproduced.

Another possibility to update the database in the memory stage 10 is obtained when the listener changes station via the operating element 14, this change including both a change to another station broadcasting the same program and a change to a station broadcasting a different program. The receiving-criteria check of the new, desired station automatically leads to an update of the database.

If the radio receiver in accordance with the invention is not only connected to or provided with the receiver stage 2 but also with other sound-signal sources (for simplicity, not shown in FIG. 1), the control unit 7 will always carry out a maximum update of the database in the memory stage 10 when a sound signal is reproduced by such other sound-signal source (cassette recorder, CD, . . . ). In this operation, both scan-tuning and evaluation of RDS data signals are used. Preferably, the same process can also be carried out when the listener turns off the radio receiver. In this case, the control unit 7 carries out a complete update, preferably so as to be unnoticed by the listener, of the database in the memory stage 10 throughout the receivable frequency range. This has the additional advantage that when the radio receiver is put into operation again use can be made of a maximally updated database.

By embodying the selection member of the operating element 14 so as to be a station-tuning knob, an ergonomically favorable operation of the radio receiver in accordance with the invention is achieved. As the selection member is operated by rotating it, it is possible to go from one station to an adjacent station as well as to select and tune into the desired station by means of large tuning steps covering the entire list of stations in the database. Problems resulting from stations which are too close to each other in this tuning movement do not occur.

The example shown in FIG. 1 comprises an auxiliary receiver stage 16, indicated by broken lines, which is not necessary in accordance with the invention, but which can be used also in the radio receiver in accordance with the invention. If updating the database in the memory stage 10 takes place via such an auxiliary receiver stage 16, which is controlled by the control unit 7, a simplification of the functional steps to be carried out by the control unit 7 is achieved, however, higher manufacturing costs must be accepted.

What is claimed is:

1. A radio receiver comprising:
   a receiver stage for receiving and demodulating radio signals;
   an evaluation stage for evaluating the quality of the received radio signals in accordance with predetermined receiving criteria;
   a storage stage for storing data concerning at least transmitter frequencies and/or transmitter names of stations corresponding to the radio signals which meet said predetermined receiving criteria;
   an operating element for setting the receiver stage to receive the radio signal of a desired station;
   a display element for displaying information concerning at least the desired station, said information being derived from the stored data; and
   a control unit for controlling at least the receiver stage, the storage stage and the display element according to the operation of the operating element, and for controlling the evaluation of the receiving quality by the evaluation stage, characterized in that for tuning the receiver stage to the desired station, the data of the stations corresponding to the radio signals which meet the predetermined receiving criteria are readable from the memory stage, in a sequence determined by the control unit in accordance with selectable characteristics, by operating the operating element, said operating element comprising a single selection member enabling switching from a desired station to a previous or a subsequent station in accordance with said sequence, the data stored in the memory stage being at least partly updated, under any one of the following freely selectable conditions, to form data of stations whose radio signals directly meet the predetermined receiving criteria:
   (a) when the receiving quality of the radio signal of a desired station currently does not, or no longer, meet the predetermined receiving criteria, the relevant data in the memory stage are erased and the receiver stage is tuned to receive the radio signal of a new, desired station wherein the new, desired station broadcasts the same program as the hitherto desired station, and the data of the new, desired station replace the erased data of the hitherto desired station in the memory stage; and the new, desired station is found by autoscanning of the receiver stage;
   (b) when the desired station is replaced by a new, desired station by operating the operating element, it is checked whether the radio signal of the new, desired station meets the predetermined receiving criteria; if so, the data in the memory stage of the control unit are replaced by the data of the new, desired station, wherein the transmission frequency of the new desired station is found by autoscanning of the receiver stage; and
   (c) before at least the receiver stage of the radio receiver is turned off, the data of the stations having radio signals which meet the predetermined receiving criteria are stored again in the memory stage by the control unit by means of an autoscanning operation for a frequency range which is as wide as possible and includes all frequencies to which the receiver stage can be tuned;
   whereby the data of the stations are gained from the determination of the transmission frequencies of the received radio signals and/or from an RDS data flow received as a part of the radio signals.

2. The radio receiver as claimed in claim 1, characterized in that at least the evaluation stage and the control unit are comprised in a microprocessor.

3. The radio receiver as claimed in claim 1, characterized in that the selection member is a station-tuning knob, and the operating element comprises incrementing means coupled to the selection member, said incrementing means serving to switch the receiver stage to a station which, in the specific sequence, is an adjacent station.

4. The radio receiver as claimed in claim 1, characterized in that the transmission frequency is selected to define the specific sequence in which the data are read from the memory stage.

5. The radio receiver as claimed in claim 1, characterized in that the station names are used to define the specific sequence in which the data are read from the memory stage.

* * * * *